US008238116B2

(12) United States Patent
Eggerding et al.

(10) Patent No.: US 8,238,116 B2
(45) Date of Patent: *Aug. 7, 2012

(54) LAND GRID FEEDTHROUGH LOW ESL TECHNOLOGY

(75) Inventors: Carl L. Eggerding, Murrells Inlet, SC (US); Andrew P. Ritter, Surfside Beach, SC (US)

(73) Assignee: AVX Corporation, Fountain Inn, SC (US)

( * ) Notice: Subject to any disclaimer, the term of this patent is extended or adjusted under 35 U.S.C. 154(b) by 1162 days.

This patent is subject to a terminal disclaimer.

(21) Appl. No.: 12/061,150

(22) Filed: Apr. 2, 2008

(65) Prior Publication Data

US 2008/0253059 A1 Oct. 16, 2008

Related U.S. Application Data

(60) Provisional application No. 60/923,388, filed on Apr. 13, 2007.

(51) Int. Cl.
*H05K 1/14* (2006.01)
*H05K 1/11* (2006.01)

(52) U.S. Cl. .................. 361/794; 361/306.1; 361/301.4; 361/782

(58) Field of Classification Search .................. 361/794, 361/306.1, 301.4, 782
See application file for complete search history.

(56) References Cited

U.S. PATENT DOCUMENTS

| 3,444,436 A | 5/1969 | Coda |
| 4,831,494 A | 5/1989 | Arnold et al. |
| 5,517,385 A | 5/1996 | Galvagni et al. |
| 5,880,925 A | 3/1999 | DuPre et al. |
| 6,243,253 B1 * | 6/2001 | DuPre et al. ............... 361/306.3 |
| 6,292,351 B1 | 9/2001 | Ahiko et al. |
| 6,344,961 B1 * | 2/2002 | Naito et al. ................... 361/302 |
| 6,380,619 B2 | 4/2002 | Ahiko et al. |
| 6,407,906 B1 | 6/2002 | Ahiko et al. |
| 6,441,459 B1 | 8/2002 | Togashi et al. |
| 6,452,781 B1 | 9/2002 | Ahiko et al. |
| 6,459,561 B1 | 10/2002 | Galvagni et al. |
| 6,483,692 B2 | 11/2002 | Figueroa et al. |
| 6,576,497 B2 | 6/2003 | Ahiko et al. |
| 6,606,237 B1 | 8/2003 | Naito et al. |
| 6,657,848 B2 | 12/2003 | Togashi et al. |
| 6,661,640 B2 | 12/2003 | Togashi |
| 6,757,152 B2 | 6/2004 | Galvagni et al. |
| 6,765,781 B2 | 7/2004 | Togashi |
| 6,768,630 B2 | 7/2004 | Togashi |
| 6,781,816 B2 | 8/2004 | Togashi |
| 6,807,047 B2 | 10/2004 | Togashi et al. |
| 6,816,356 B2 | 11/2004 | Devoe et al. |
| 6,822,847 B2 | 11/2004 | Devoe et al. |
| 6,885,544 B2 | 4/2005 | Kim et al. |
| 6,914,767 B2 | 7/2005 | Togashi et al. |
| 6,917,510 B1 | 7/2005 | Prymak |
| 6,922,329 B2 | 7/2005 | Togashi |
| 6,950,300 B2 | 9/2005 | Sutardja |

(Continued)

*Primary Examiner* — Yuriy Semenenko
*Assistant Examiner* — Andargie M Aychillhum
(74) *Attorney, Agent, or Firm* — Dority & Manning, P.A.

(57) ABSTRACT

Disclosed are apparatus and methodology for providing land grid feedthrough capacitor designs having broad applicability to signal and power filtering technologies. Such capacitor designs provide characteristics for use in decoupling applications involving both signal level and power level environments. Low equivalent series inductance (ESL) is provided by current cancellation techniques involving opposite current flow in power or signal and ground current paths through the device.

10 Claims, 5 Drawing Sheets

U.S. PATENT DOCUMENTS

| | | |
|---|---|---|
| 6,956,730 B2 | 10/2005 | Togashi |
| 6,958,899 B2 | 10/2005 | Togashi et al. |
| 6,965,507 B2 | 11/2005 | Togashi et al. |
| 6,970,342 B1 | 11/2005 | Togashi |
| 6,995,967 B2 | 2/2006 | Togashi et al. |
| 6,999,300 B2 | 2/2006 | Togashi et al. |
| 7,019,957 B2 | 3/2006 | Togashi et al. |
| 7,019,958 B2 | 3/2006 | Togashi et al. |
| 7,038,905 B2 | 5/2006 | Yoshihara et al. |
| 7,050,288 B2 | 5/2006 | Ahiko et al. |
| 7,050,289 B2 | 5/2006 | Togashi |
| 7,054,134 B2 | 5/2006 | Togashi et al. |
| 7,061,747 B2 | 6/2006 | Togashi et al. |
| 7,075,774 B2 | 7/2006 | Togashi et al. |
| 7,085,124 B2 | 8/2006 | Togashi |
| 7,088,569 B1 | 8/2006 | Togashi et al. |
| 7,099,138 B1 | 8/2006 | Togashi et al. |
| 7,145,429 B1 | 12/2006 | Togashi et al. |
| 7,152,291 B2 | 12/2006 | Ritter et al. |
| 7,230,816 B2 | 6/2007 | Sutardja |
| 7,283,348 B2 | 10/2007 | Togashi et al. |
| 7,298,604 B2 | 11/2007 | Togashi et al. |
| 7,310,217 B2 | 12/2007 | Takashima et al. |
| 7,697,262 B2 * | 4/2010 | Ritter et al. ............... 361/306.1 |
| 2002/0041006 A1 | 4/2002 | Ahiko et al. |
| 2003/0011963 A1 | 1/2003 | Ahiko et al. |
| 2003/0026059 A1 | 2/2003 | Togashi |
| 2003/0102502 A1 | 6/2003 | Togashi |
| 2003/0161089 A1 | 8/2003 | Togashi |
| 2003/0227738 A1 | 12/2003 | Togashi |
| 2004/0066589 A1 | 4/2004 | Togashi |
| 2004/0179325 A1 | 9/2004 | Togashi et al. |
| 2004/0183147 A1 | 9/2004 | Togashi et al. |
| 2004/0184202 A1 | 9/2004 | Togashi et al. |
| 2005/0041368 A1 | 2/2005 | Togashi |
| 2005/0047059 A1 | 3/2005 | Togashi |
| 2005/0190529 A1 | 9/2005 | Togashi |
| 2005/0201040 A1 | 9/2005 | Ahiko et al. |
| 2005/0207093 A1 | 9/2005 | Togashi et al. |
| 2005/0213287 A1 | 9/2005 | Yoshihara et al. |
| 2005/0219791 A1 | 10/2005 | Togashi et al. |
| 2005/0219792 A1 | 10/2005 | Togashi et al. |
| 2005/0264977 A1 | 12/2005 | Togashi |
| 2005/0286203 A1 | 12/2005 | Togashi et al. |
| 2005/0286205 A1 | 12/2005 | Togashi et al. |
| 2005/0286206 A1 | 12/2005 | Togashi et al. |
| 2006/0007634 A1 | 1/2006 | Togashi et al. |
| 2006/0028785 A1 | 2/2006 | Togashi et al. |
| 2006/0120017 A1 | 6/2006 | Togashi |
| 2006/0133057 A1 | 6/2006 | McGregor et al. |
| 2006/0152886 A1 | 7/2006 | Togashi et al. |
| 2006/0164789 A1 | 7/2006 | Togashi et al. |
| 2006/0176644 A1 | 8/2006 | Togashi et al. |
| 2006/0203422 A1 | 9/2006 | Togashi |
| 2006/0203425 A1 | 9/2006 | Togashi et al. |
| 2006/0203426 A1 | 9/2006 | Togashi et al. |
| 2006/0203427 A1 | 9/2006 | Togashi et al. |
| 2006/0209492 A1 | 9/2006 | Togashi |
| 2006/0214263 A1 | 9/2006 | Kojima et al. |
| 2006/0221545 A1 | 10/2006 | Togashi |
| 2006/0221546 A1 | 10/2006 | Togashi |
| 2007/0096254 A1 | 5/2007 | Ritter et al. |
| 2008/0049377 A1 | 2/2008 | Sutardja |

* cited by examiner

LAND GRID FEEDTHROUGH LOW ESL TECHNOLOGY

PRIORITY CLAIM

This application claims the benefit of previously filed U.S. Provisional Patent Application entitled "LAND GRID FEEDTHROUGH LOW ESL TECHNOLOGY", assigned U.S. Ser. No. 60/923,388, filed Apr. 13, 2007, and which is incorporated herein by reference for all purposes.

FIELD OF THE INVENTION

The present subject mater relates to capacitors. More particularly, the present subject matter relates to vertically oriented, multi-layer ceramic capacitor structures having broad applicability to signal and power filtering technologies.

BACKGROUND OF THE INVENTION

The present subject matter generally concerns improved component design for decoupling capacitors that generally results in devices characterized by relatively low cost and low Equivalent Series Inductance (ESL).

As switching speeds increase and pulse rise times decrease in electronic circuit applications, the need to reduce inductance becomes a serious limitation for improved system performance. Even the decoupling capacitors, which act as a local energy source, can generate unacceptable voltage spikes: $V=L$ (di/dt). Thus, in high speed circuits where di/dt can be quite large, the size of the potential voltage spikes can only be reduced by reducing the inductance value L.

There may be several strategies for reducing equivalent series inductance, or ESL, of chip capacitors compared to standard multilayer chip capacitors. Likewise, there may be strategies for addressing Equivalent Series Resistance (ESR) using patterned internal electrodes and resistive paste termination materials. One exemplary strategy employs patterned internal electrodes. A first exemplary strategy for reducing ESL involves reverse geometry termination, such as employed in low inductance chip capacitor (LICC) designs. In such LICCs, electrodes are terminated on the long side of a chip instead of the short side. Since the total inductance of a chip capacitor is determined in part by its length to width ratio, LICC reverse geometry termination results in a reduction in inductance by as much as a factor of six from conventional MLC chips.

Interdigitated capacitors (IDCs) incorporate another strategy for reducing capacitor inductance. IDCs incorporate electrodes having a main portion and multiple tab portions that connect to respective terminations formed on the capacitor periphery. Multiple such terminations can help reduce the parasitic inductance of a device. Examples of interdigitated capacitors are disclosed in U.S. Pat. No. 6,243,253 (DuPre et al.)

A still further technology utilized for reduction in capacitor inductance involves designing alternative current paths to minimize the mutual inductance factor of capacitor electrodes. A low inductance chip array (LICA) product, such as manufactured and sold by AVX Corporation, minimizes mutual inductance by configuring a ball grid array multilayer capacitor such that the charging current flowing out of a positive plate returns in the opposite direction along an adjacent negative plate. Utilization of LICA technology achieves low inductance values by low aspect ratio of the electrodes, and arrangement of electrode tabs so as to cancel inductance and vertical aspect of the electrodes to the mounting surface.

Additional references that incorporate adjacent electrodes having reverse current paths used to minimize inductance include U.S. Published Patent Application No. 2005/0047059 (Togashi et al.) and U.S. Pat. No. 6,292,351 (Ahiko et al.) Both such references also utilize a vertical aspect of electrodes relative to a mounting surface. Additional references that disclose electrodes for use in a vertically-oriented position include U.S. Pat. No. 5,517,385 (Galvagni et al.), U.S. Pat. No. 4,831,494 (Arnold et al.) and U.S. Pat. No. 6,885,544 (Kim et al.)

A known reference that discloses features aimed to reduce inductance in an integrated circuit package that includes, in part, a capacitive device is U.S. Pat. No. 6,483,692 (Figueroa et al.). Such reference recognizes that inductance relates to circuit board "loop area" or the electrical distance (or span) that current must follow. It is desirable in Figeuroa et al. to minimize such loop area, thus reducing the inductance levels. Extended surface lands are also provided in Figueroa et al., providing a larger surface area that is said to result in more reliable connections characterized by reduced inductance and resistance levels.

U.S. Pat. No. 6,661,640 (Togashi) also discloses features for reducing ESL of a decoupling capacitor by maximizing the surface area of device terminations. U.S. Pat. No. 6,917,510 (Prymak) discloses a capacitor embodiment with terminal extensions formed to result in a narrow gap between the electrodes. The end electrodes of U.S. Pat. No. 6,822,847 (Devoe et al.) also cover all but a thin separation line at a central portion of the capacitor body.

Still further known references that include features for reducing component inductance correspond to U.S. Pat. No. 6,757,152 (Galvagni et al.) and U.S. Pat. No. 6,606,237 (Naito et al.), in which conductive vias are utilized to form generally low inductance connections to upper electrodes in a multilayer capacitor.

Additional background references that may address certain aspects of low-inductance multilayer electronic devices include U.S. Pat. No. 6,576,497 (Ahiko et al.) and U.S. Pat. No. 3,444,436 (Coda) as well as U.S. Published Patent Application No. 2004/0184202 (Togashi et al.).

While various aspects and alternative features are known in the field of multilayer electronic components and related methods for manufacture, no one design has emerged that generally addresses all of the issues as discussed herein. The disclosures of all the foregoing United States patents and published patent applications are hereby fully incorporated into this application for all purposes by virtue of present reference thereto.

SUMMARY OF THE INVENTION

In view of the recognized features encountered in the prior art and addressed by the present subject matter, improved apparatus and methodology for reducing inductance is a multi-layer ceramic capacitor has been developed.

In an exemplary configuration, vertically oriented capacitor structure is provided that may be sized to provide a wide range of capacitance values and effective filtering capabilities for signal level lines as well as decoupling of power level lines or circuit planes.

In one of their simpler forms, a multi-layer, vertically oriented ceramic capacitor structure is provided that provides a low Equivalent Series Inductance (ESL) by employing current canceling techniques.

Another positive aspect of this type of device is that capacitors may be produced in accordance with the present technology resulting in relatively small devices that allow for distributed placement of the devices over a circuit board.

In accordance with aspects of certain embodiments of the present subject matter, methodologies are provided to optimize current cancellation within the device to minimize ESL.

In accordance with certain aspects of other embodiments of the present subject matter, methodologies have been developed to provide land grid feedthrough capacitors having characteristics for decoupling applications.

In accordance with yet additional aspects of further embodiments of the present subject matter, apparatus and accompanying methodologies have been developed to provide vertically oriented devices based on land grid array (LGA) and fine copper termination (FCT) technologies.

According to yet still other aspects of additional embodiments of the present subject matter, apparatus and methodologies have been developed to provide devices with relatively high capacitance values.

One present exemplary embodiment relates to a multilayer electronic component, comprising a plurality of first and second electrode layers, and first and second conductive termination layer material. Preferably, each first electrode layer comprises a first dielectric layer having first and second surfaces thereof bounded by four edges and a first conductive layer covering a portion of such first surface of such first dielectric layer and extending to at least a portion of each corner of such first dielectric layer. Preferably, such plurality of second electrode layers are alternately stacked with such plurality of first electrode layers, each second electrode layer comprising a second dielectric layer having first and second surfaces thereof bounded by four edges and a second conductive layer covering a portion of such first surface of such second dielectric layer, situated between the corners of such first dielectric layer, and extending to at least a portion of two opposing edges of such second dielectric layer. Such first conductive termination layer material preferably covers respective pairs of corners of such first electrode layers and electrically connecting such first conductive layer of each of such plurality of first electrode layers while such second conductive termination layer material covers such portion of such two opposing edges of such second dielectric situated between such corners of such first dielectric layer and electrically connecting such second conductive layer of each of such plurality of second electrode layers. Preferably, such first conductive termination layer material and such second conductive termination layer material are configured so as to form a gap therebetween along a portion of such at least one edge of both such first and second electrode layers, whereby a current loop area is formed from such first conductive termination layer through such plurality of first electrode layers and plurality of second electrode layers to such second conductive termination layer which cooperates with an associated circuit board for forming respective current cancellation pathways, for lowering equivalent series inductance of such component.

In particular alternative forms of the foregoing embodiment, preferably such first conductive termination layer material comprises respective first conductive termination layers covering such respective pairs of corners of such first electrode layers. In still further alternative forms of the foregoing, each of such second conductive layers preferably extends to at least two respective portions of such two opposing edges of each of such second dielectric layers; and such second conductive termination layer material comprises respective second conductive termination layers covering such at least two respective portions of such two opposing edges of such second dielectric layers.

In other present exemplary embodiments of a circuit board combination, such combination may comprise an embodiment of the foregoing exemplary multilayer electronic component subject matter, further combined with at least four conductive traces formed on a same side of such circuit board, and configured so that an outer pair of such conductive traces have the same spacing as such respective first conductive termination layers of such multilayer electronic component, and configured so that an inner pair of such conductive traces have the same spacing as such respective second conductive termination layers of such multilayer electronic component; a segmented first conductive plane formed in such circuit board; a segmented second conductive plane formed in such circuit board; a first pair of conductive vias formed through such circuit board and configured to couple respectively such segments of such first conductive layer to such respective first conductive termination layers; and a second pair of conductive vias formed through such circuit board and configured to couple respectively such second conductive layer to such respective second conductive termination layers. In some exemplary embodiments of such circuit board combination, preferably such first conductive layer may comprise one of a power or signal path; and such second conductive layer may comprise a ground plane.

In such foregoing exemplary embodiments, terminal spacing may alternatively be minimized at such gap so as to provide reduction in equivalent series inductance of such component as such gap is reduced.

In still further alternative exemplary embodiments of a present exemplary multilayer electronic component, such four edges of each of such first and second dielectric layers may comprise two opposite relatively longer edges and two opposite relatively shorter edges, and wherein such conductive termination layer materials may be formed at least along one of such relatively longer edges, whereby such multilayer electronic component may be configured for mounting on a substrate along such at least one of such relatively longer edges. In yet further alternatives of such an arrangement, such conductive termination layer materials may also be formed at least along the other of such relatively longer edges, so that termination lands are provided for mounting other electrical components to such multilayer electronic component.

Another present exemplary embodiment may relate to a circuit board and electronic component combination, comprising a four-terminal multilayer land grid feedthrough vertically-oriented ceramic capacitor mounted on a multilayer printed circuit board, for effective filtering capabilities for signal level lines and decoupling of power level lines or circuit planes, and for providing low equivalent series inductance by employing current canceling techniques. Such exemplary combination may further include a plurality of first electrode layers, each first electrode layer comprising a first dielectric layer having first and second surfaces thereof bounded by four edges and a first conductive layer covering a portion of such first surface of such first dielectric layer and extending to at least a portion of each corner of such first dielectric layer; a plurality of second electrode layers alternately stacked with such plurality of first electrode layers, each second electrode layer comprising a second dielectric layer having first and second surfaces thereof bounded by four edges and a second conductive layer covering a portion of such first surface of such second dielectric layer, situated between the corners of such first dielectric layer, and extending to at least two respective portions of two opposing edges of such second dielectric layer; respective first conductive termination layers covering respective pairs of corners of such first electrode layers and electrically connecting such first conductive layer of each of such plurality of first electrode layers; respective second conductive termination layers covering such at least two respective portions of such two opposing edges of such second dielectric layers situated between such corners of such first dielectric layer and electrically connecting such second conductive layer of each of such plurality of second electrode layers; at least four conductive traces formed on a same side of such circuit board, and configured so that an outer pair of such conductive traces have the same spacing as such respective first conductive termination layers of such multilayer electronic component and are electrically connected therewith, and configured so that an inner pair of such conductive traces have the same spacing as such respective second conductive termination layers of such multilayer electronic component and are electrically connected therewith; a segmented first conductive plane formed in such circuit board, and comprising one of a power or signal path; a segmented second conductive plane formed in such circuit board, and comprising a ground plane; a first pair of conductive vias formed through such circuit board and configured to couple respectively such segments of such first conductive layer to such respective first conductive termination layers; and a second pair of conductive vias formed through such circuit board and configured to couple respectively such second conductive layer to such respective second conductive termination layers; wherein such first conductive termination layers and such second conductive termination layers are configured so as to form respective gaps therebetween along a portion of such at least one edge of both such first and second electrode layers; and whereby a current loop area is formed from such first conductive termination layers through such plurality of first electrode layers and plurality of second electrode layers to such second conductive termination layers which cooperates with such conductive traces, such pairs of conductive vias, and such conductive planes, for forming respective current cancellation pathways, for lowering equivalent series inductance of such component.

Another present exemplary embodiment may relate to a four-terminal multilayer land grid feedthrough vertically-oriented ceramic capacitor for mounting on a multilayer printed circuit board, for effective filtering capabilities for signal level lines and decoupling of power level lines or circuit planes, and for providing low equivalent series inductance by employing current canceling techniques. Such present exemplary combination may further include a plurality of first electrode layers, each first electrode layer comprising a first dielectric layer having first and second surfaces thereof bounded by four edges and a first conductive layer covering a portion of such first surface of such first dielectric layer and extending to at least a portion of each corner of such first dielectric layer; a plurality of second electrode layers alternately stacked with such plurality of first electrode layers, each second electrode layer comprising a second dielectric layer having first and second surfaces thereof bounded by four edges and a second conductive layer covering a portion of such first surface of such second dielectric layer, situated between the corners of such first dielectric layer, and extending to at least two respective portions of two opposing edges of such second dielectric layer; respective first conductive termination layers covering respective pairs of corners of such first electrode layers and electrically connecting such first conductive layer of each of such plurality of first electrode layers; and respective second conductive termination layers covering such at least two respective portions of such two opposing edges of such second dielectric layers situated between such corners of such first dielectric layer and electrically connecting such second conductive layer of each of such plurality of second electrode layers. In such exemplary embodiment, such first conductive termination layers and such second conductive termination layers are configured so as to form respective gaps therebetween along a portion of such at least one edge of both such first and second electrode layers; and whereby a current loop area is formed from such first conductive termination layers through such plurality of first electrode layers and plurality of second electrode layers to such second conductive termination layers which cooperates with an associated circuit board for forming respective current cancellation pathways, for lowering equivalent series inductance of such capacitor.

Yet another present exemplary embodiment may relate to a circuit board and electronic component combination, comprising a multilayer land grid feedthrough vertically-oriented ceramic capacitor mounted on a multilayer printed circuit board, for effective filtering capabilities for signal level lines and decoupling of power level lines or circuit planes, and for providing low equivalent series inductance by employing current canceling techniques, such combination further including a plurality of first electrode layers, each first electrode layer comprising a first dielectric layer having first and second surfaces thereof bounded by four edges and a first conductive layer covering a portion of such first surface of such first dielectric layer and extending to at least a portion of each corner of such first dielectric layer; a plurality of second electrode layers alternately stacked with such plurality of first electrode layers, each second electrode layer comprising a second dielectric layer having first and second surfaces thereof bounded by four edges and a second conductive layer covering a portion of such first surface of such second dielectric layer, situated between the corners of such first dielectric layer, and extending to at least a portion of two opposing edges of such second dielectric layer; first conductive termination layer material covering respective pairs of corners of such first electrode layers and electrically connecting such first conductive layer of each of such plurality of first electrode layers; second conductive termination layer material covering such portion of such two opposing edges of such second dielectric situated between such corners of such first dielectric layer and electrically connecting such second conductive layer of each of such plurality of second electrode layers; at least four conductive traces formed on a same side of such circuit board, and configured so that an outer pair of such conductive traces have spacing which aligns with such first conductive termination layer materials of such multilayer electronic component and are electrically connected therewith, and configured so that an inner pair of such conductive traces have spacing which aligns with such second conductive termination layer materials of such multilayer electronic component and are electrically connected therewith; a segmented first conductive plane formed in such circuit board, and comprising one of a power or signal path; a segmented second conductive plane formed in such circuit board, and comprising a ground plane; a first pair of conductive vias formed through such circuit board and configured to couple respectively such segments of such first conductive layer to such first conductive termination layer materials; and a second pair of conductive vias formed through such circuit board and configured to couple respectively such second conductive layer to such second conductive termination layer materials; wherein such first conductive termination layer materials and such second conductive termination layer materials are configured so as to form at least one gap therebetween along a portion of such at least one edge of both such first and second electrode layers; and whereby a current loop area is formed from such first conductive termination layer materials through such plurality of first electrode layers and plurality of second electrode layers to such second conductive termination layer materials which cooperates with such conductive traces, such pairs of conductive vias, and such conductive planes, for forming respective current cancellation pathways, for lowering equivalent series inductance of such component.

Present exemplary embodiments equally relate to corresponding methodology. One exemplary present method relates to a method of making a multilayer electronic component, comprising providing a plurality of first electrode layers, each first electrode layer comprising a first dielectric layer having first and second surfaces thereof bounded by four edges and a first conductive layer covering a portion of such first surface of such first dielectric layer and extending to at least a portion of each corner of such first dielectric layer; providing a plurality of second electrode layers alternately stacked with such plurality of first electrode layers, each second electrode layer comprising a second dielectric layer having first and second surfaces thereof bounded by four edges and a second conductive layer covering a portion of such first surface of such second dielectric layer, situated between the corners of such first dielectric layer, and extending to at least a portion of two opposing edges of such second dielectric layer; positioning such first and second plurality of electrode layers in respective alternating layers; providing first conductive termination layer material covering respective pairs of corners of such first electrode layers and electrically connecting such first conductive layer of each of such plurality of first electrode layers; providing second conductive termination layer material covering such portion of such two opposing edges of such second dielectric situated between such corners of such first dielectric layer and electrically connecting such second conductive layer of each of such plurality of second electrode layers; configuring such first conductive termination layer material and such second conductive termination layer material so as to form a gap therebetween along a portion of such at least one edge of both such first and second electrode layers; and forming a current loop area from such first conductive termination layer through such plurality of first electrode layers and plurality of second electrode layers to such second conductive termination layer which cooperates with an associated circuit board for forming respective current cancellation pathways, for lowering equivalent series inductance of such component.

A present exemplary method of making a circuit board combination may comprise providing a multilayer electronic component in accordance with the foregoing exemplary methodology; providing at least four conductive traces formed on a same side of such circuit board, and configured so that an outer pair of such conductive traces have the same spacing as such respective first conductive termination layers of such multilayer electronic component, and configured so that an inner pair of such conductive traces have the same spacing as such respective second conductive termination layers of such multilayer electronic component; providing a segmented first conductive plane formed in such circuit board; providing a segmented second conductive plane formed in such circuit board; providing a first pair of conductive vias formed through such circuit board and configured to couple respectively such segments of such first conductive layer to such respective first conductive termination layers; and providing a second pair of conductive vias formed through such circuit board and configured to couple respectively such second conductive layer to such respective second conductive termination layers.

Yet another exemplary present methodology relates to a method of making a circuit board and electronic component combination, comprising a four-terminal multilayer land grid feedthrough vertically-oriented ceramic capacitor mounted on a multilayer printed circuit board, for effective filtering capabilities for signal level lines and decoupling of power level lines or circuit planes, and for providing low equivalent series inductance by employing current canceling techniques. Such exemplary present method preferably comprises providing a plurality of first electrode layers, each first electrode layer comprising a first dielectric layer having first and second surfaces thereof bounded by four edges and a first conductive layer covering a portion of such first surface of such first dielectric layer and extending to at least a portion of each corner of such first dielectric layer; providing a plurality of second electrode layers alternately stacked with such plurality of first electrode layers, each second electrode layer comprising a second dielectric layer having first and second surfaces thereof bounded by four edges and a second conductive layer covering a portion of such first surface of such second dielectric layer, situated between the corners of such first dielectric layer, and extending to at least two respective portions of two opposing edges of such second dielectric layer; positioning such first and second plurality of electrode layers in respective alternating layers; providing respective first conductive termination layers covering respective pairs of corners of such first electrode layers and electrically connecting such first conductive layer of each of such plurality of first electrode layers; providing respective second conductive termination layers covering such at least two respective portions of such two opposing edges of such second dielectric layers situated between such corners of such first dielectric layer and electrically connecting such second conductive layer of each of such plurality of second electrode layers; providing at least four conductive traces formed on a same side of such circuit board, and configured so that an outer pair of such conductive traces have the same spacing as such respective first conductive termination layers of such multilayer electronic component and are electrically connected therewith, and configured so that an inner pair of such conductive traces have the same spacing as such respective second conductive termination layers of such multilayer electronic component and are electrically connected therewith; providing a segmented first conductive plane formed in such circuit board, and comprising one of a power or signal path; providing a segmented second conductive plane formed in such circuit board, and comprising a ground plane; providing a first pair of conductive vias formed through such circuit board and configured to couple respectively such segments of such first conductive layer to such respective first conductive termination layers; providing a second pair of conductive vias formed through such circuit board and configured to couple respectively such second conductive layer to such respective second conductive termination layers; configuring such first conductive termination layers and such second conductive termination layers so as to form respective gaps therebetween along a portion of such at least one edge of both such first and second electrode layers; and forming a current loop area from such first conductive termination layers through such plurality of first electrode layers and plurality of second electrode layers to such second conductive termination layers which cooperates with such conductive traces, such pairs of conductive vias, and such conductive planes, for forming respective current cancellation pathways, for lowering equivalent series inductance of such component.

Additional objects and advantages of the present subject matter are set forth in, or will be apparent to, those of ordinary skill in the art from the detailed description herein. Also, it should be further appreciated that modifications and variations to the specifically illustrated, referred and discussed features and elements hereof may be practiced in various embodiments and uses of the present subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which.

Repeat use of reference characters throughout the present specification and appended drawings is intended to represent same or analogous features or elements of the present subject matter.

DETAILED DESCRIPTION OF THE PREFERRED EMBODIMENTS

As discussed in the Summary of the Invention section, the present subject matter is particularly concerned with improved apparatus and methodology for reducing inductance is a multi-layer ceramic capacitor.

Selected combinations of aspects of the disclosed technology correspond to a plurality of different embodiments of the present subject matter. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

Figure 1:
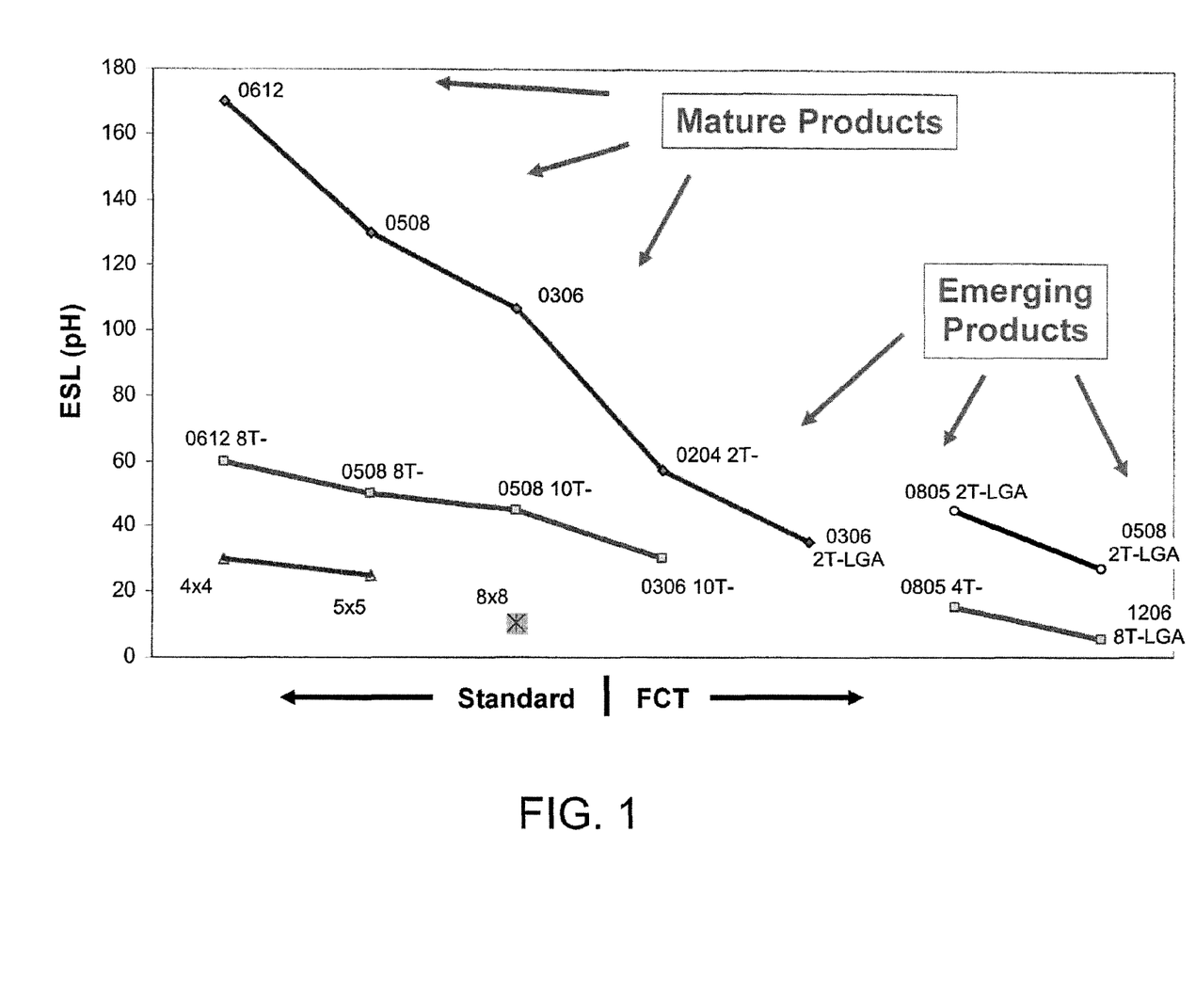
FIG. 1 is a graphical representation of historical progress in the development of low ESL devices based on various technologies illustrating comparisons to the present technology.

Reference will now be made in detail to the presently preferred embodiments of the subject low ESL capacitors. Referring now to the drawings, FIG. 1 is a graphical representation of historical progress in the development of low ESL devices based on various technologies. As may be seen, technologies including LICC and IDC capacitor configurations have provided continuous improvement using standard techniques to reduce ESL in mature product devices. Emerging products, such as those constructed in accordance with the present technology and, in particular, employing 2, 4, and 8 terminal land grid array configurations together with fine copper termination (FCT) techniques, have achieved further reductions in ESL.

Figure 2:
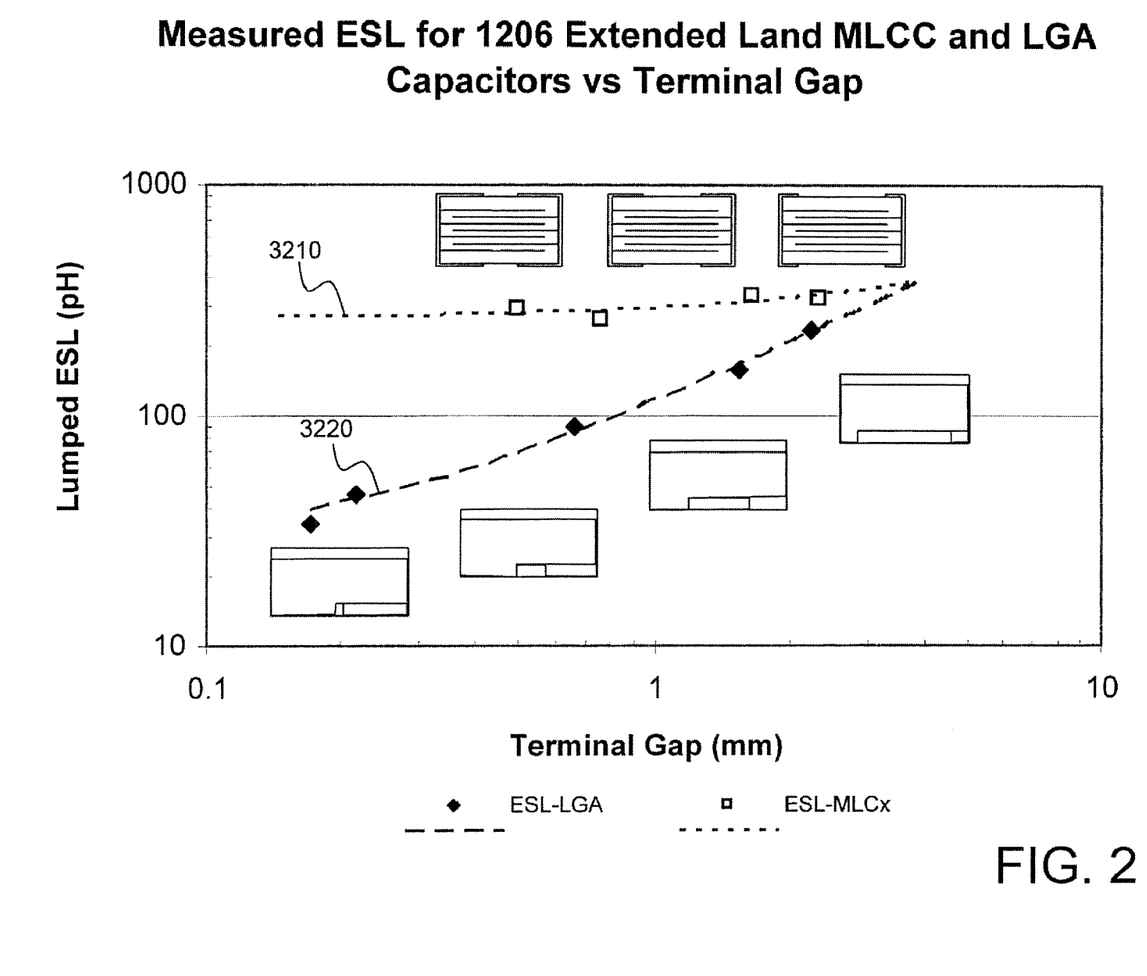
FIG. 2 provides a graphical comparison of general inductance trends for low inductance MLCC components especially depicting lumped ESL values versus cancellation loop width for multiple exemplary LGA capacitor embodiments of differing sizes.

With reference now to FIG. 2, there is illustrated a graphical comparison of general inductance trends for low inductance MLCC components especially depicting lumped ESL values versus cancellation loop width for multiple exemplary LGA capacitor embodiments of differing sizes. Aspects related to current cancellation loop have a significant impact on ESL. As may be seen from FIG. 2, as the total loop size diminishes so does the ESL of the device. Further illustrations of such effect in comparison to current loops formed with the devices constructed in accordance with the present technology will be seen in FIGS. 4a and 5a as described more fully hereinbelow.

Figure 3:
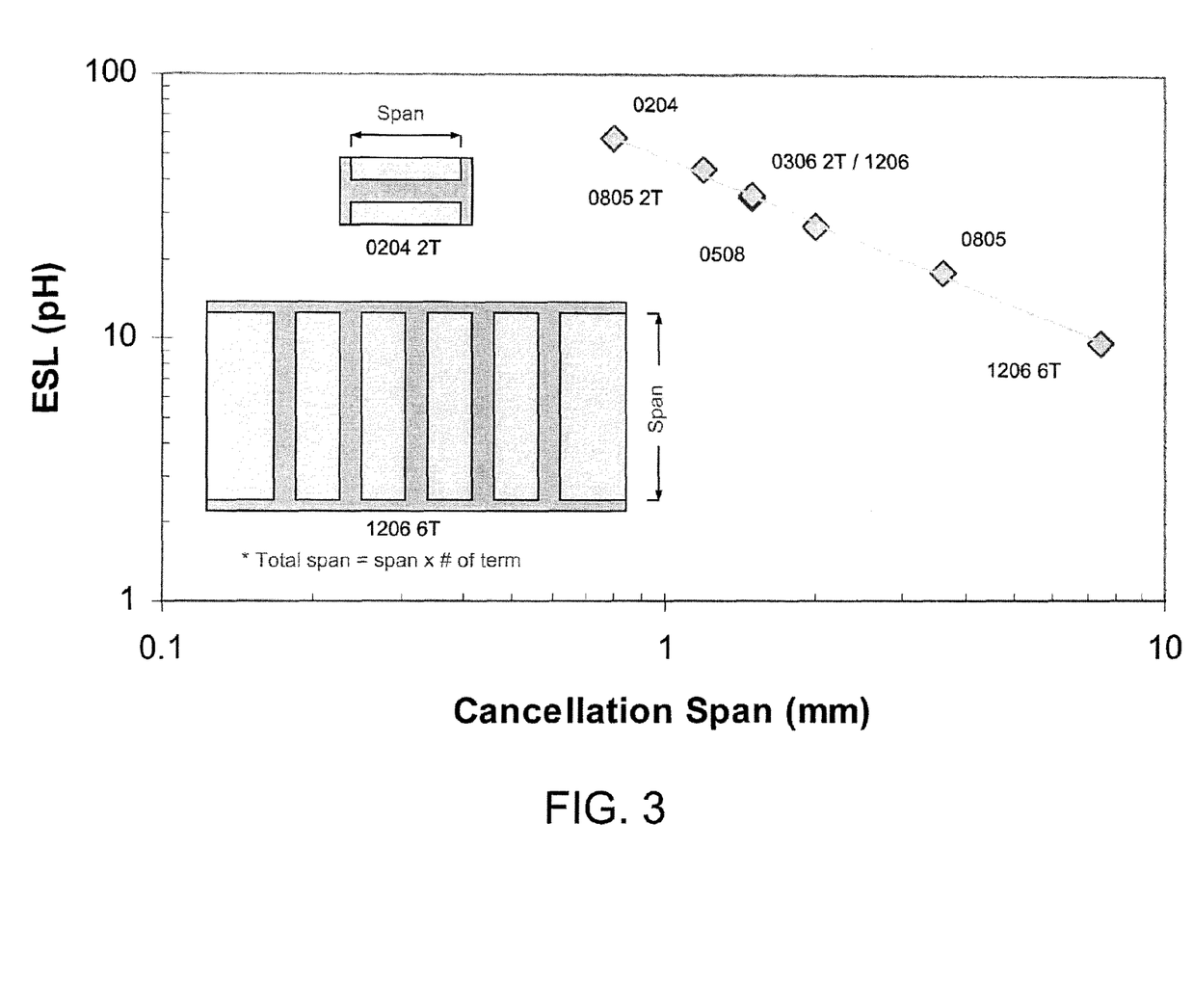
FIG. 3 provides a graphical comparison of Land Grid Array (LGA) Equivalent Series Inductance (ESL) vs. electrode span length.

With reference to FIG. 3, there is illustrated a graphical comparison of Land Grid Array (LGA) Equivalent Series Inductance (ESL) vs. electrode span length. As with the graphical representation of FIG. 3, it may be noticed here that variations in the total electrode span have a significant impact on ESL.

Figures 4A, 4B, 4C:
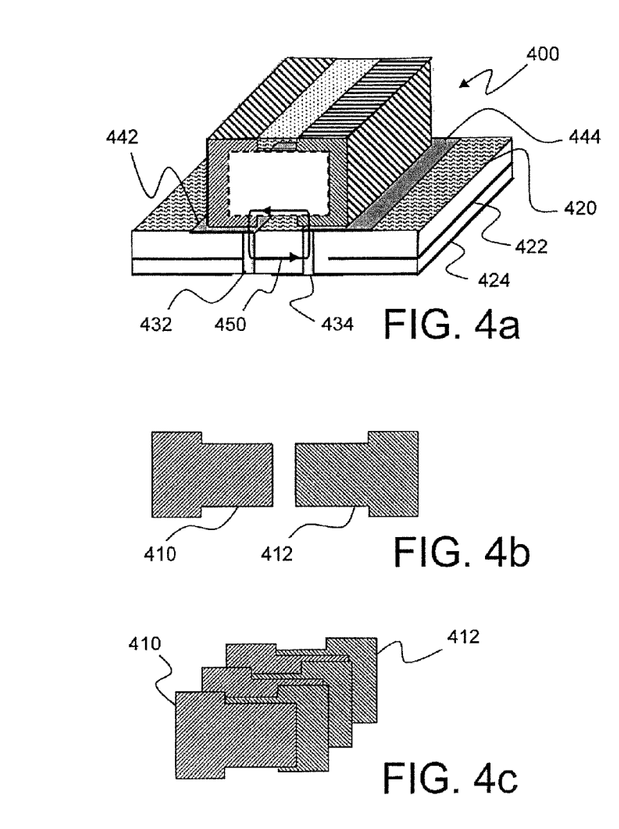
FIGS. 4a through 4c, respectively, depict construction and aspects of a current loop for an exemplary vertical electrode capacitor embodiment in accordance with known technology mounted on a multi-layer printed circuit board.
Figure 5A:
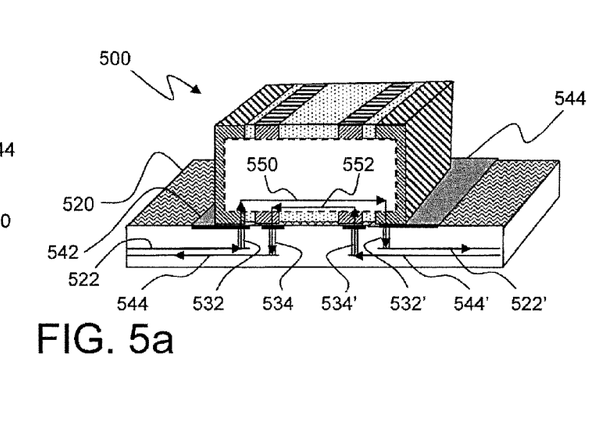
FIGS. 5a through 5c, respectively, depict construction and aspects of a current loop for an exemplary four-terminal Land Grid Feedthrough (LGF) capacitor in accordance with the present technology mounted on a multi-layer printed circuit board.
Figures 5B, 5C:
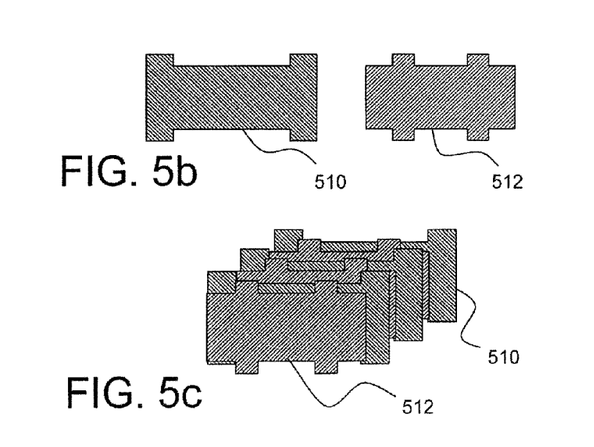

With reference to FIGS. 4a, 4b, 4c, 5a, 5b, and 5c, collectively designated as FIGS. 4 and 5, respectively, there are illustrated, in the case of FIG. 4, a known configuration 400 in comparison to the technology of the present subject matter as illustrated in FIG. 5. First as may be seen in FIGS. 4b and 5b there are illustrated respective electrode designs for each of the devices corresponding to first electrode 410, 510, and second electrode 412, 512 pairs. Further, as may be seen in FIGS. 4c and 5c, such respective electrode pairs may be stacked to produce a multi-layer device. It should be appreciated that while each of FIGS. 4c and 5c illustrate three stacked pairs of electrodes, such is exemplary only as there may, in fact, be other numbers of such pairs, or many more such pairs in a manufactured product.

With reference now to FIGS. 4a and 5a, it will be seen that capacitors 400, 500 are illustrated each mounted on printed circuit boards 420, 520, respectively, so as to more fully illustrate current loops formed respectively in each device. First, with respect to known multi-layer capacitor 400, it will be noticed that capacitor 400 is illustrated mounted on a multi-layer printed circuit board 420 that has provided therein a first conductive plane 422 and a ground plane 424. First conductive plane 422 may correspond to either a signal plane or a power plane depending on the environment in which the device is to be operated. Conductive traces 442, 444 and via connections 432, 434 are provided to electrically couple capacitor 400 to conductive plane 422 and ground plane 424 as illustrated. Current flow through device 400 forms a current loop 450 whose size depends on the exact electrode configuration which may vary as previously illustrated in FIG. 2. Such variations have a significant impact on device ESL.

With reference now to FIGS. 5a, 5b, and 5c, it will be seen that there is illustrated a capacitor 500 mounted on multi-layer printed circuit board 520 and constructed in accordance with the present technology and is illustrated similarly to the known configuration of FIGS. 4a, 4b, and 4c for comparison. FIG. 5b illustrates electrode pairs 510, 512 similar to electrode pairs 410, 412 of FIG. 4b. In like manner, FIG. 5c illustrates a stack of three sets of electrode pairs 510, 512, similar to the stack illustrated in FIG. 4c. As with FIG. 4c, it should be appreciated that the electrode stack illustrated in FIG. 5c is exemplary only any may actually correspond to many more stacked layers than presently illustrated.

With respect now to FIG. 5a, there is illustrated multi-layer capacitor 500 constructed in accordance with the present technology mounted on multi-layer printed circuit board 520. Printed circuit board 520 contains therein a first conductive plane that may be divided into separate portions 522, 522' and a ground plane that may also be divided into separate portions 544, 544'. Conductive plane portion 522 may be connected by via 532 to a first tab portion 510a (FIG. 5b) of first electrode 510 while conductive plane portion 522' may be connected by via 532' to a second tab portion 510b (FIG. 5b) of first electrode 510.

In similar fashion, the ground plane may be divided into separate portions 544, 544'. Ground plane portion 544 may be connected by via 534 to a first tab portion 512a (FIG. 5b) of second electrode 512 while ground plane portion 544' may be connected by via 534' to a second tab portion 512b (FIG. 5b) of second electrode 512. Such connections result in current flow paths 550, 552 providing opposite direction current flows through capacitor 500. In accordance with the present technology, such opposite current flow paths provide current cancellation effects that provide significant reduction in ESL for capacitor 500.

Figures 6A, 6B:
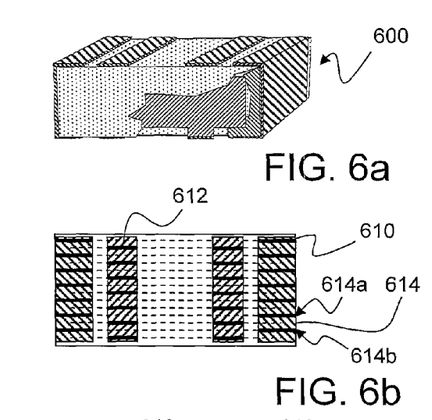
FIGS. 6a, 7a, and 8a depict, respectively, partially cutaway perspective views of first, second, and third embodiments of Land Grid Feedthrough capacitors constructed in accordance with the present technology.
FIGS. 6b, 7b, and 8b depict, respectively, top and bottom views (which have the same appearance) of tab and internal electrode configurations of first, second, and third embodiments of Land Grid Feedthrough capacitors constructed in accordance with the present technology.
Figure 6C:
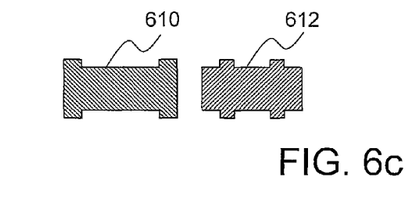
FIGS. 6c, 7c, and 8c depict, respectively, internal electrode configuration of first, second, and third embodiments of Land Grid Feedthrough capacitors constructed in accordance with the present technology.
Figure 6D:
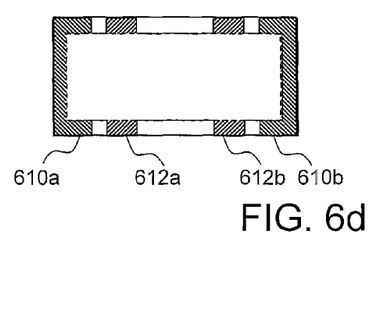
FIGS. 6d, 7d, and 8d depict, respectively, cross sectional views on electrode planes showing electrode relationships of first, second, and third embodiments of Land Grid Feedthrough capacitors constructed in accordance with the present technology.
Figure 7A:
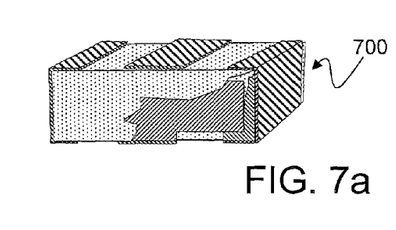
Figure 7B:
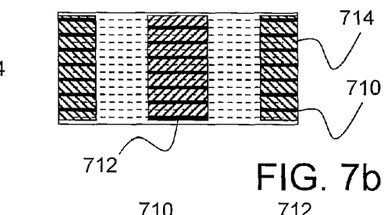
Figure 7C:
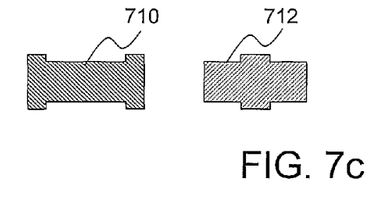
Figure 7D:
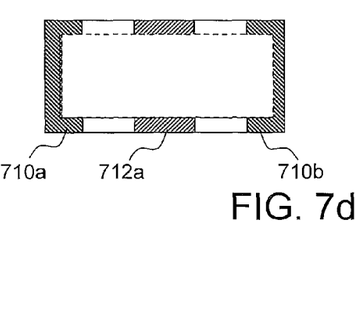
Figure 8A:
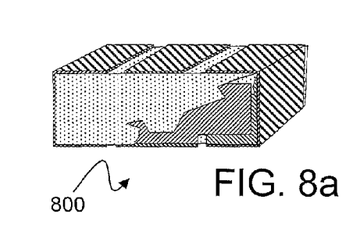
Figure 8B:
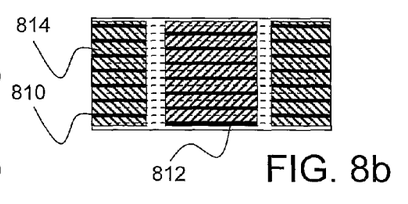
Figure 8C:
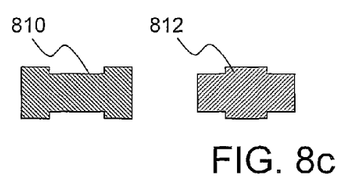
Figure 8D:
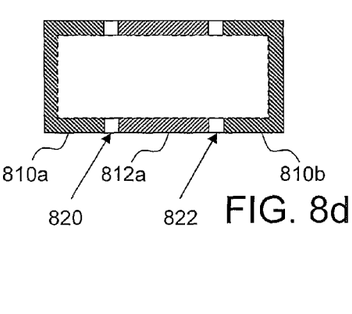

With respect now to FIGS. 6a-d, 7a-d, and 8a-d, there is illustrated several different exemplary embodiments of the present technology. The subject matter of FIGS. 6a-d corresponds generally with that of FIGS. 5a-c as previously described. FIG. 6b is substantially duplicative of FIG. 5b in that there is illustrated first electrode 610 and second electrode 612 forming a pair of electrodes that may be stacked as illustrated in FIG. 6b separated by insulative layers 614 having a first surface 614a and a second surface 614b to form capacitor 600 as illustrated in partially cut-away perspective view in FIG. 6a. It should be appreciated that in each of FIGS. 6c, 7c, and 8c the scale of the respective electrodes illustrated is not the same as the respective scales of the stacked representations.

With respect to FIGS. 7a, 7b, 7c, and 7d, such figures represent a three terminal Land Grid Feedthrough capacitor 700 embodiment of the present subject matter that in an electrical context is similar to a standard feedthrough capacitor. FIGS. 8a, 8b, 8c, and 8d represent an exemplary low inductance Land Grid Feedthrough capacitor 800 embodiment of the present subject matter that provides a mechanism similar to known configurations illustrated in FIGS. 2 and 4a, 4b, and 4c in that such exemplary embodiment provides minimized terminal spacing at gaps 820, 822 that provide reduction in ESL as the gap size is reduced as previously described. While the width of such gaps may be varied in accordance with the present subject matter, one exemplary embodiment is for such gaps to be in a range of about between 100 and 400 microns. In other exemplary embodiments, such gaps may each be about 250 microns.

While the present subject matter has been described in detail with respect to specific embodiments thereof, it will be appreciated that those skilled in the art, upon attaining an understanding of the foregoing may readily produce alterations to, variations of, and equivalents to such embodiments. For example, various materials may be presently used in various embodiments in accordance with the present subject matter. For example, the above-referenced conductive layers may be selected from the group consisting of platinum, nickel, copper, and palladium-silver alloy, while the dielectric layers may be selected from the group consisting of barium titanate, zinc oxide, alumina with low-fire glass, ceramics, glass-bonded materials, and an organic epoxy. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A multilayer electronic component, comprising:
   a plurality of first electrode layers, each first electrode layer comprising a first dielectric layer having first and second surfaces thereof bounded by four edges and a first conductive layer covering a portion of said first surface of said first dielectric layer and extending to at least a portion of each corner of said first dielectric layer;
   a plurality of second electrode layers alternately stacked with said plurality of first electrode layers, each second electrode layer comprising a second dielectric layer having first and second surfaces thereof bounded by four edges and a second conductive layer covering a portion of said first surface of said second dielectric layer, situated between the corners of said first dielectric layer, and extending to at least a portion of two opposing edges of said second dielectric layer;
   first conductive termination layer material covering respective pairs of corners of said first electrode layers and electrically connecting said first conductive layer of each of said plurality of first electrode layers; and
   second conductive termination layer material covering said portion of said two opposing edges of said second dielectric situated between said corners of said first dielectric layer and electrically connecting said second conductive layer of each of said plurality of second electrode layers;
   wherein said first conductive termination layer material and said second conductive termination layer material are configured so as to form a gap therebetween along a portion of said at least one edge of both said first and second electrode layers;

whereby a current loop area is formed from said first conductive termination layer through said plurality of first electrode layers and plurality of second electrode layers to said second conductive termination layer which cooperates with an associated circuit board for forming respective current cancellation pathways, for lowering equivalent series inductance of said component.

2. A multilayer electronic component as in claim 1, wherein said first conductive termination layer material comprises respective first conductive termination layers covering said respective pairs of corners of said first electrode layers.

3. A multilayer electronic component as in claim 2, wherein:
   each of said second conductive layers extends to at least two respective portions of said two opposing edges of each of said second dielectric layers; and
   said second conductive termination layer material comprises respective second conductive termination layers covering said at least two respective portions of said two opposing edges of said second dielectric layers.

4. A multilayer electronic component as in claim 1, wherein terminal spacing is minimized at said gap so as to provide reduction in equivalent series inductance of said component as said gap is reduced.

5. A multilayer electronic component as in claim 1, wherein said four edges of each of said first and second dielectric layers comprise two opposite relatively longer edges and two opposite relatively shorter edges, and wherein said conductive termination layer materials are formed at least along one of said relatively longer edges, whereby said multilayer electronic component may be configured for mounting on a substrate along said at least one of said relatively longer edges.

6. A multilayer electronic component as in claim 5, wherein said conductive termination layer materials are also formed at least along the other of said relatively longer edges, so that termination lands are provided for mounting other electrical components to said multilayer electronic component.

7. A four-terminal multilayer land grid feedthrough vertically-oriented ceramic capacitor for mounting on a multilayer printed circuit board, for effective filtering capabilities for signal level lines and decoupling of power level lines or circuit planes, and for providing low equivalent series inductance by employing current canceling techniques, such combination further including:
   a plurality of first electrode layers, each first electrode layer comprising a first dielectric layer having first and second surfaces thereof bounded by four edges and a first conductive layer covering a portion of said first surface of said first dielectric layer and extending to at least a portion of each corner of said first dielectric layer;
   a plurality of second electrode layers alternately stacked with said plurality of first electrode layers, each second electrode layer comprising a second dielectric layer having first and second surfaces thereof bounded by four edges and a second conductive layer covering a portion of said first surface of said second dielectric layer, situated between the corners of said first dielectric layer, and extending to at least two respective portions of two opposing edges of said second dielectric layer;
   respective first conductive termination layers covering respective pairs of corners of said first electrode layers and electrically connecting said first conductive layer of each of said plurality of first electrode layers; and
   respective second conductive termination layers covering said at least two respective portions of said two opposing edges of said second dielectric layers situated between said corners of said first dielectric layer and electrically connecting said second conductive layer of each of said plurality of second electrode layers;
   wherein said first conductive termination layers and said second conductive termination layers are configured so as to form respective gaps therebetween along a portion of said at least one edge of both said first and second electrode layers; and
   whereby a current loop area is formed from said first conductive termination layers through said plurality of first electrode layers and plurality of second electrode layers to said second conductive termination layers which cooperates with an associated circuit board for forming respective current cancellation pathways, for lowering equivalent series inductance of said capacitor.

8. A capacitor as in claim 7, wherein terminal spacing is minimized at said respective gaps so as to provide reduction in equivalent series inductance of said capacitor as said gaps are reduced.

9. A capacitor as in claim 7, wherein said four edges of each of said first and second dielectric layers comprise two opposite relatively longer edges and two opposite relatively shorter edges, and wherein said conductive termination layers are formed at least along one of said relatively longer edges, whereby said capacitor may be configured for mounting on a substrate along said at least one of said relatively longer edges.

10. A capacitor as in claim 9, wherein said conductive termination layers are also formed at least along the other of said relatively longer edges, so that termination lands are provided for mounting other electrical components to said capacitor.

* * * * *